(12) United States Patent
Tanaka

(10) Patent No.: US 10,337,939 B2
(45) Date of Patent: Jul. 2, 2019

(54) WATERPROOF MEMBER, MANUFACTURING METHOD OF WATERPROOF MEMBER, PRESSURE SENSOR, AND ELECTRONIC MODULE

(71) Applicant: Seiko Epson Corporation, Tokyo (JP)

(72) Inventor: Nobuyuki Tanaka, Chino (JP)

(73) Assignee: Seiko Epson Corporation (JP)

( * ) Notice: Subject to any disclaimer, the term of this patent is extended or adjusted under 35 U.S.C. 154(b) by 325 days.

(21) Appl. No.: 15/421,809

(22) Filed: Feb. 1, 2017

(65) Prior Publication Data

US 2017/0234754 A1 Aug. 17, 2017

(30) Foreign Application Priority Data

Feb. 15, 2016 (JP) .................................. 2016-025612

(51) Int. Cl.
| | | |
|---|---|---|
| *B01D 67/00* | (2006.01) | |
| *B01D 69/12* | (2006.01) | |
| *B81C 1/00* | (2006.01) | |
| *G01L 7/08* | (2006.01) | |
| *G01L 19/14* | (2006.01) | |
| *B81B 7/00* | (2006.01) | |

(52) U.S. Cl.
CPC ............ *G01L 19/14* (2013.01); *B81B 7/0058* (2013.01); *B81C 1/00333* (2013.01); *G01L 7/08* (2013.01); *B81B 2201/0264* (2013.01); *B81B 2203/0127* (2013.01); *B81C 2201/0176* (2013.01); *B81C 2201/0181* (2013.01)

(58) Field of Classification Search
CPC ........ B01D 67/00; B01D 69/00; B01D 69/12; B01D 71/00; B81B 7/00; B81B 7/0058; B81B 2201/0264; B81B 2203/0127; B81C 1/00; B81C 1/00333; B81C 99/00; B81C 2201/0176; B81C 2201/0181; G01L 7/08; G01L 19/14
See application file for complete search history.

(56) References Cited

U.S. PATENT DOCUMENTS

| | | | |
|---|---|---|---|
| 9,011,776 B2 * | 4/2015 | Ziglioli | B81B 7/0058 |
| | | | 422/68.1 |
| 9,138,690 B2 * | 9/2015 | Manabe | B01D 39/1692 |
| 2011/0013799 A1 * | 1/2011 | Fang | H04R 1/086 |
| | | | 381/355 |
| 2014/0061892 A1 | 3/2014 | Ziglioli et al. | |
| 2016/0207006 A1 * | 7/2016 | Furuyama | H05K 5/0213 |
| 2017/0292000 A1 * | 10/2017 | Furuyama | B01D 71/48 |

FOREIGN PATENT DOCUMENTS

| | | | | |
|---|---|---|---|---|
| JP | 51048789 A | * | 4/1976 | ............ D06M 10/00 |
| JP | 2015-143634 A | | 8/2015 | |

* cited by examiner

*Primary Examiner* — Nguyen Q. Ha
(74) *Attorney, Agent, or Firm* — Harness, Dickey & Pierce, P.L.C.

(57) ABSTRACT

A waterproof member includes a laminated body including a second silicon layer and a second silicon oxide layer, and a through hole that is provided in the laminated body, prevents passing of liquid, and allows passing of gas, the through hole includes a first through hole that passes through the second silicon layer, and a second through hole passing through the second silicon oxide layer and communicating with the first through hole, and a width of the second through hole is smaller than a width of the first through hole.

20 Claims, 16 Drawing Sheets

WATERPROOF MEMBER, MANUFACTURING METHOD OF WATERPROOF MEMBER, PRESSURE SENSOR, AND ELECTRONIC MODULE

BACKGROUND

1. Technical Field

The present invention relates to a waterproof member, a manufacturing method of the waterproof member, a pressure sensor, and an electronic module.

2. Related Art

In the related art, a configuration according to JP-A-2015-143634 is known as a pressure sensor having waterproofness. A pressure sensor of JP-A-2015-143634 includes a package, a pressure sensor accommodated within the package, and a gel filled in the package so as to cover the pressure sensor, and pressure outside the package is transmitted to the pressure sensor through the gel. According to such a configuration, since adhesion of moisture to the pressure sensor is prevented by the gel, it is possible to exhibit the waterproofness.

However, in a configuration of JP-A-2015-143634, it is very unlikely to densely fill the package with the gel without generating bubble within the package, and know-how is also necessary. When the bubble (void) is generated within the gel, since pressure outside the package and pressure transmitted to the pressure sensor are different from each other, there is a problem that pressure detection accuracy is lowered.

SUMMARY

An advantage of some aspects of the invention is to provide a waterproof member, a manufacturing method of the waterproof member, a pressure sensor, and an electronic module, capable of easily granting waterproofness.

The advantage can be achieved by the following configurations.

A waterproof member according to an aspect of the invention includes: a laminated body that includes a first layer and a second layer provided in one side of the first layer; and a through hole that is provided in the laminated body, prevents passing of liquid, and allows passing of gas, in which the through hole includes a first through hole that passes through the first layer, and a second through hole that passes through the second layer, and communicates with the first through hole, and in which a width of the second through hole is smaller than a width of the first through hole.

By using the waterproof member of the configuration, it is possible to easily grant waterproofness.

In the waterproof member according to the aspect of the invention, it is preferable that the width of the second through hole gradually decreases toward a direction which is separated from the first layer.

With this configuration, the second through hole is easily formed and the second through hole having an enough small width can be obtained.

In the waterproof member according to the aspect of the invention, it is preferable that a gradually decrease rate of the width of the second through hole gradually decreases toward the direction which is separated from the first layer.

With this configuration, the second through hole is easily formed and the second through hole having an enough small width can be obtained.

In the waterproof member according to the aspect of the invention, it is preferable that the width of the second through hole on a surface of the second layer opposite to the first layer is equal to or greater than 0.1 μm, and equal to or less than 10 μm.

With this configuration, it is possible to implement the second through hole having an enough small width and higher waterproofness can be obtained.

In the waterproof member according to the aspect of the invention, it is preferable that the laminated body includes a third layer provided on the first layer opposite to the second layer, and the third layer includes a first opening having a width greater than that of the through hole.

With this configuration, it is possible to increase mechanical strength of the waterproof member. In addition, the waterproof member is easily manufactured.

In the waterproof member according to the aspect of the invention, it is preferable that the laminated body includes a fourth layer that is provided between the first layer and the third layer, and forms a gap between the first through hole and the first opening, the fourth layer includes a second opening having a width greater than that of the through hole, and the through hole and the first opening communicates with each other through the second opening.

With this configuration, the waterproof member is easily manufactured.

A manufacturing method of a waterproof member according to another aspect of the invention includes: preparing a first layer in which a first through hole is provided; and film-forming a second layer having a second through hole communicating with the first through hole on one surface of the first layer, by a vapor phase growth method, in which a width of the second through hole is smaller than that of the first through hole.

With this configuration, it is possible to easily manufacture the waterproof member.

In the manufacturing method of a waterproof member according to the aspect of the invention, it is preferable that the vapor phase growth method is performed in a state where a gap is formed in a side of the first through hole opposite to a side on which the second layer is formed.

With this configuration, it is possible to easily form the second through hole.

A pressure sensor according to still another aspect of the invention includes: a substrate that includes a diaphragm; a pressure reference chamber that is positioned at one side of the diaphragm; and the waterproof member according to the aspect of the invention provided in the other side of the diaphragm, in which the diaphragm and the waterproof member are sealed in a liquid tight manner.

With this configuration, the pressure sensor with a waterproof function can be obtained with a simple configuration.

An electronic module according to yet another aspect of the invention includes: a package that includes a base including a concave portion, and the waterproof member according to the aspect of the invention bonded to the base so as to block an opening of the concave portion; and an electronic component that is accommodated within the concave portion of the package.

With this configuration, the electronic module with a waterproof function can be obtained with a simple configuration.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a waterproof member, a manufacturing method of the waterproof member, a pressure sensor, and an electronic module will be described in detail based on embodiments illustrated in the accompanying drawings.

First Embodiment

The waterproof member according to a first embodiment of the invention will be described.

Figure 1:
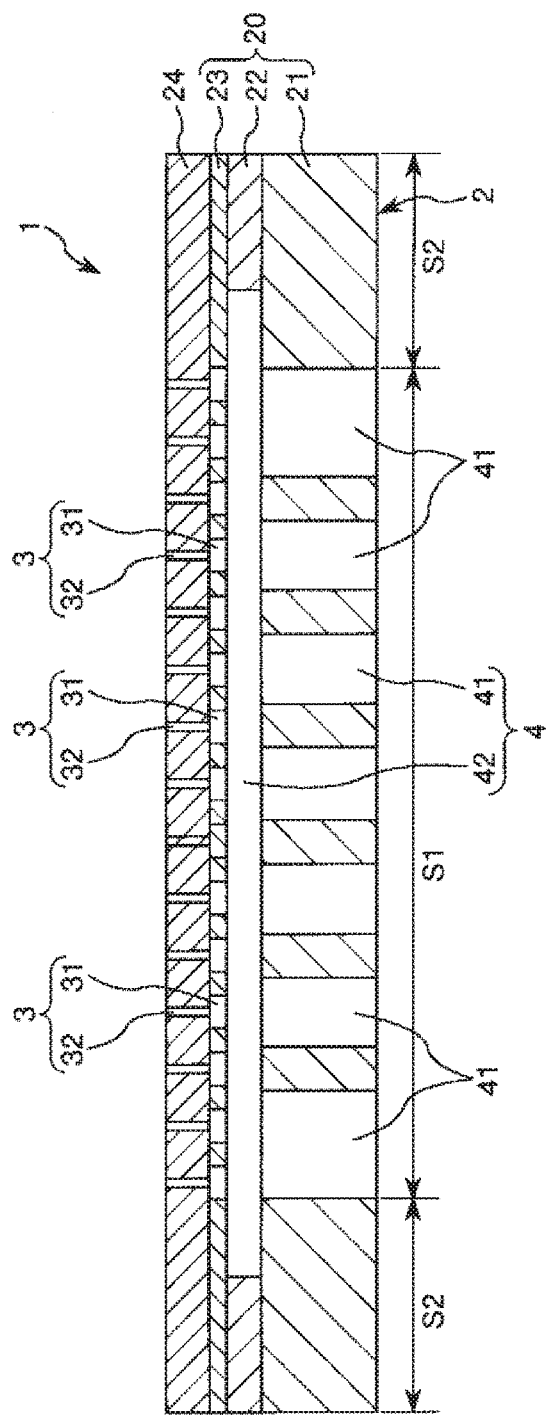
FIG. 1 is a sectional view of a waterproof member according to a first embodiment of the invention.
Figure 2:
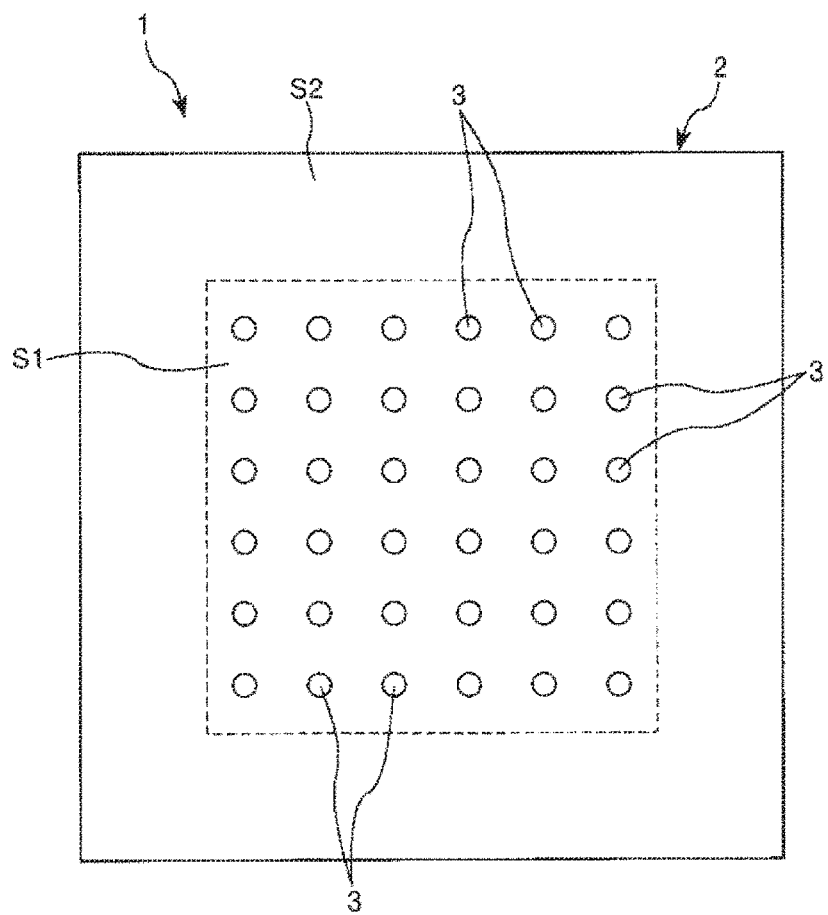
FIG. 2 is a plan view of the waterproof member illustrated in FIG. 1.
Figure 3:
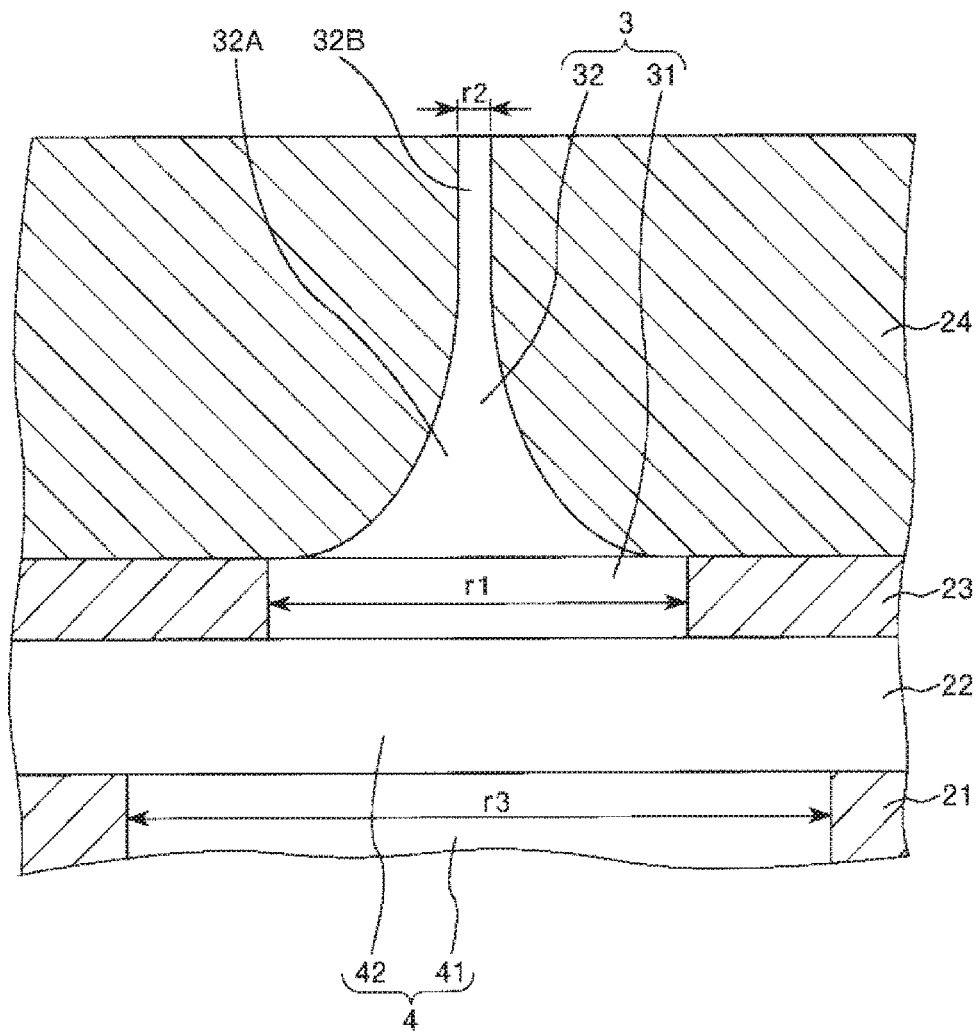
FIG. 3 is an enlarged sectional view of the waterproof member illustrated in FIG. 1.
Figure 4:
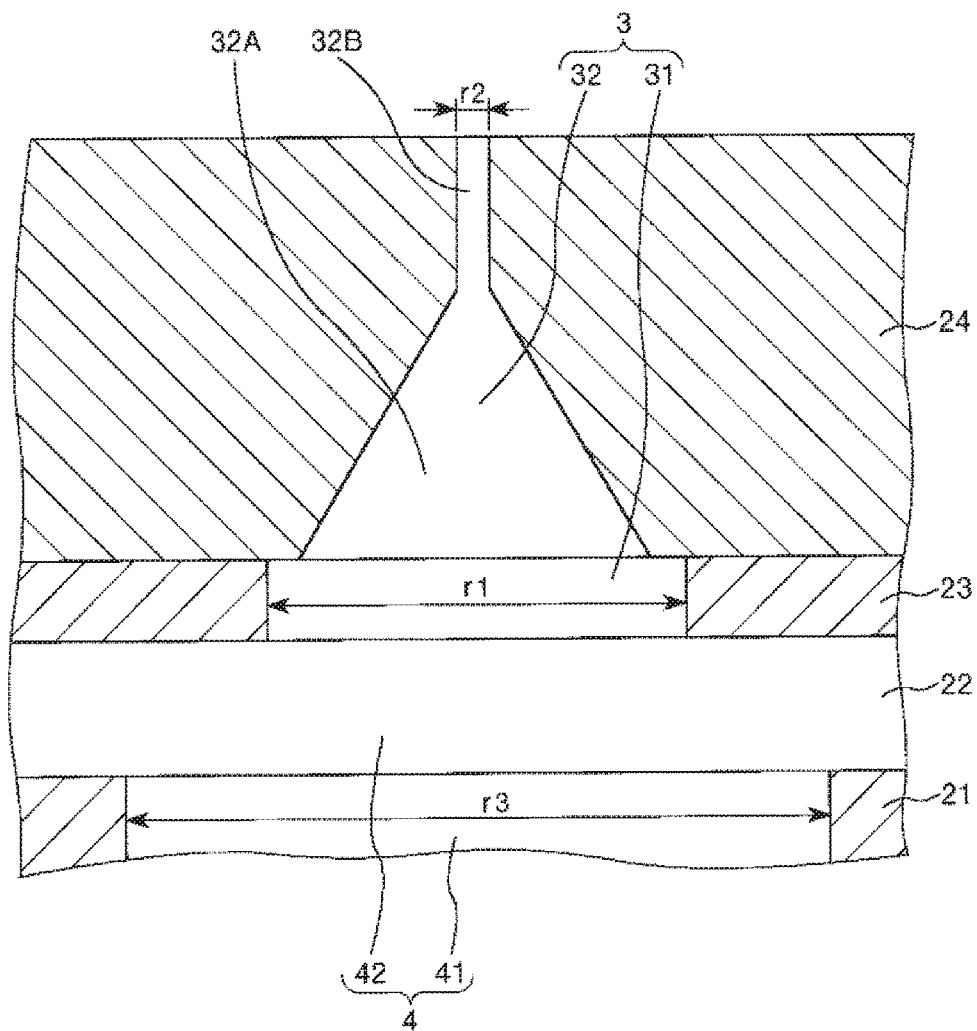
FIG. 4 is an enlarged sectional view illustrating a modification example of the waterproof member illustrated in FIG. 1.
Figure 5:
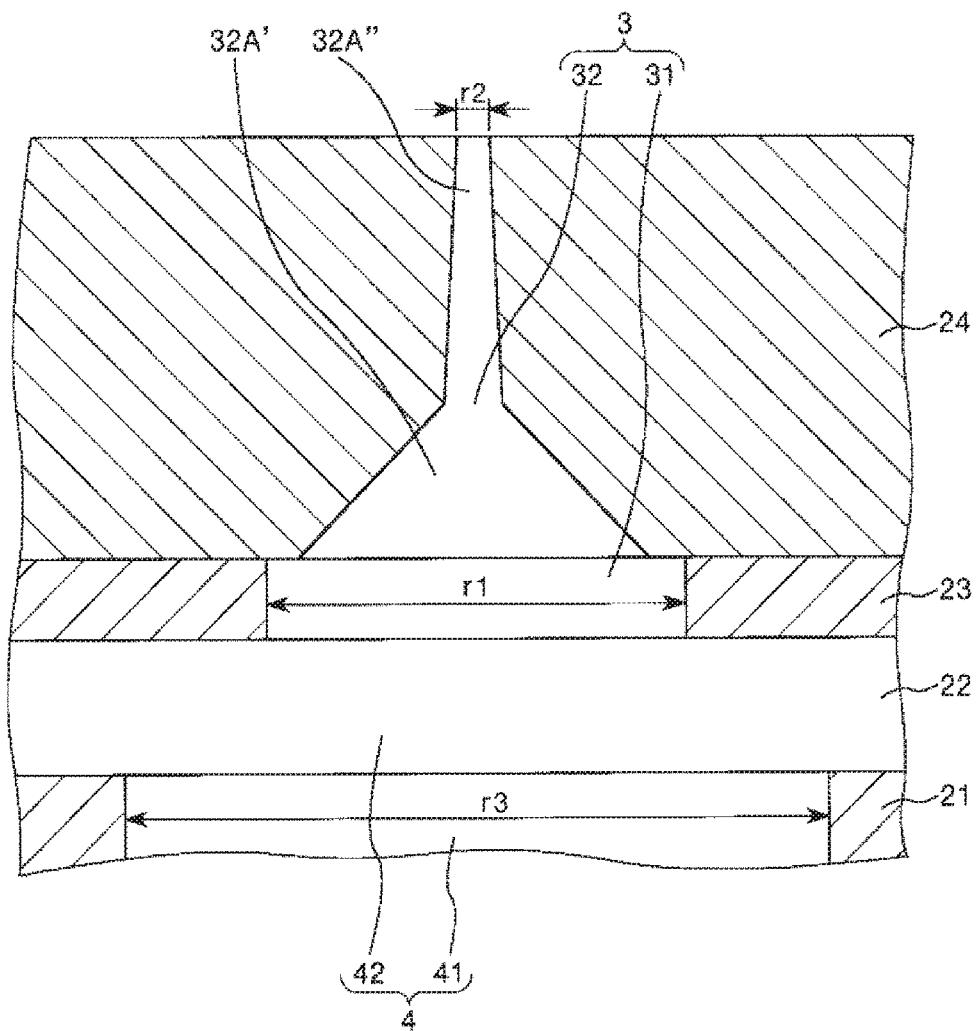
FIG. 5 is an enlarged sectional view illustrating a modification example of the waterproof member illustrated in FIG. 1.
Figure 6:
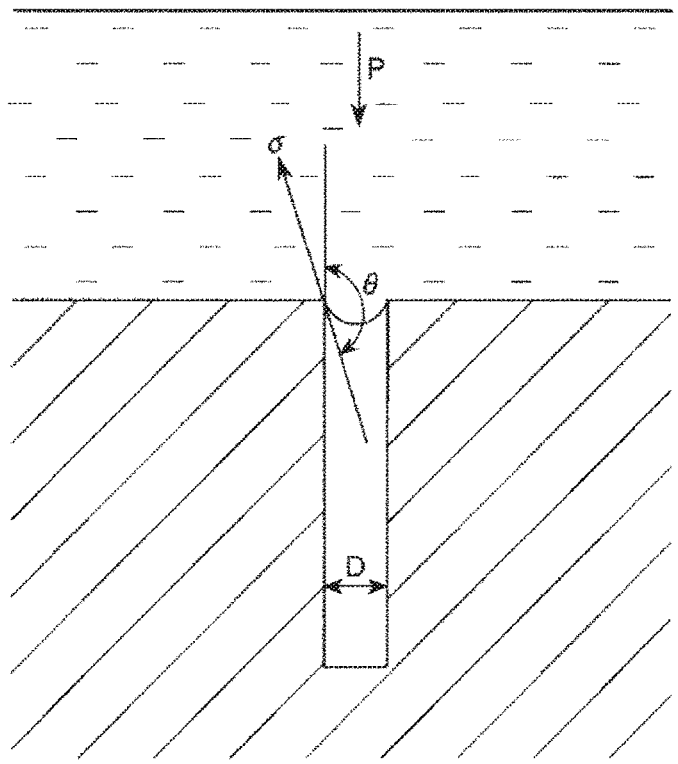
FIG. 6 is a schematic diagram for explaining a method of determining a diameter of a through hole.
Figure 7:
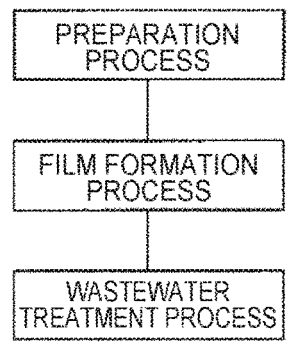
FIG. 7 is a flowchart of a manufacturing method of the waterproof member illustrated in FIG. 1.
Figure 13:
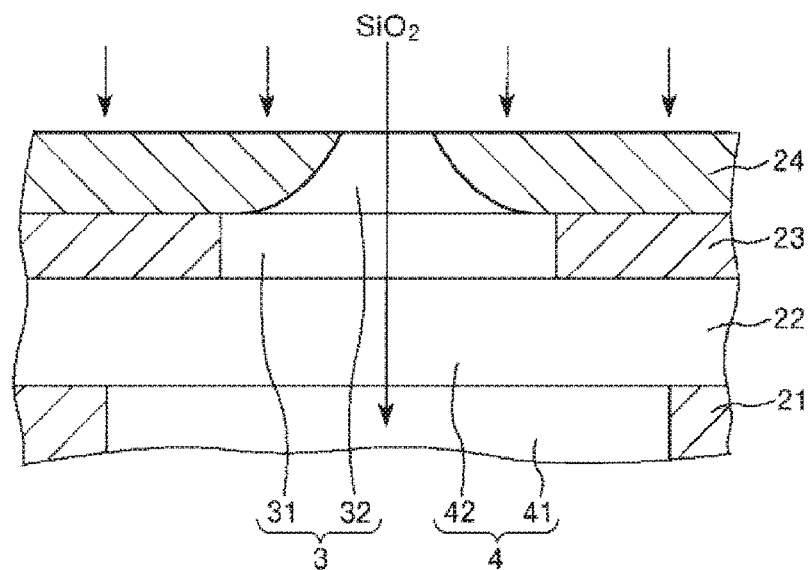
FIG. 13 is a sectional view for explaining the manufacturing method of the waterproof member illustrated in FIG. 1.
Figure 14:
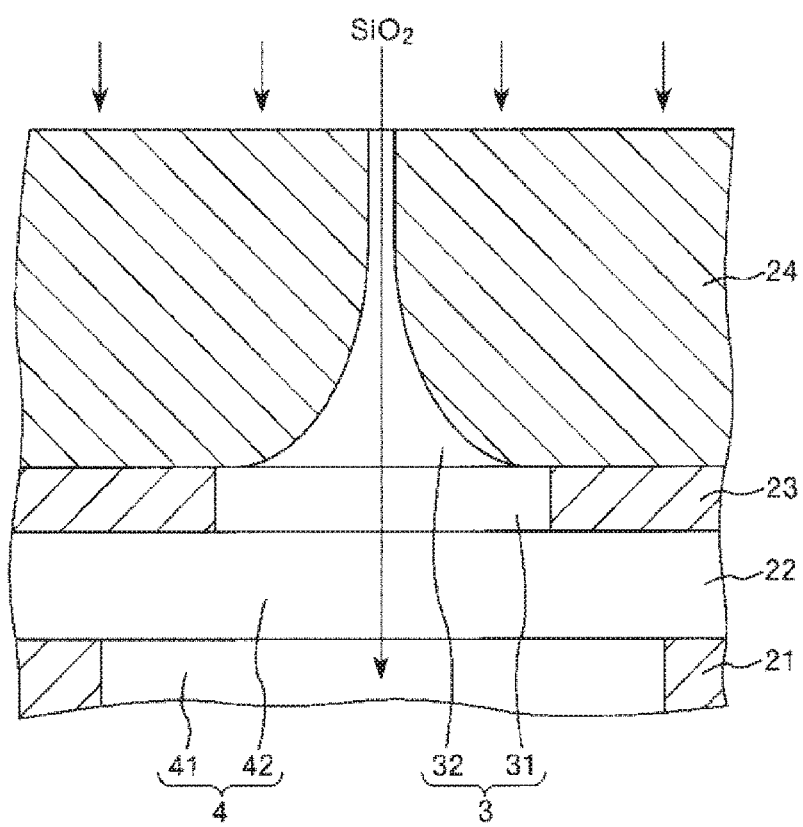
FIG. 14 is a sectional view for explaining the manufacturing method of the waterproof member illustrated in FIG. 1.
Figure 15:
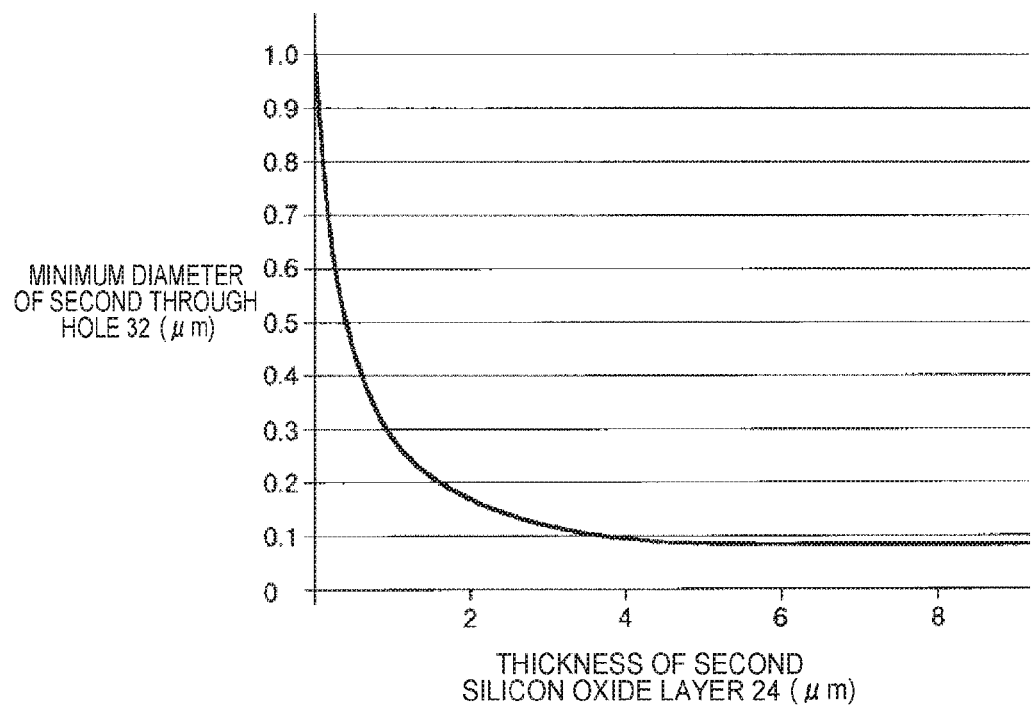
FIG. 15 is a graph illustrating a relationship of a thickness of a second silicon oxide layer and a diameter of a second through hole.

FIG. 1 is a sectional view of a waterproof member according to a first embodiment of the invention. FIG. 2 is a plan view of the waterproof member illustrated in FIG. 1. FIG. 3 is an enlarged sectional view of the waterproof member illustrated in FIG. 1. FIG. 4 and FIG. 5 are respectively enlarged sectional views illustrating a modification example of the waterproof member illustrated in FIG. 1. FIG. 6 is a schematic diagram of explaining a method for determining a diameter of a through hole. FIG. 7 is a flowchart of the manufacturing method of the waterproof member illustrated in FIG. 1. FIG. 8 to FIG. 14 are respectively sectional views for explaining the manufacturing method of the waterproof member illustrated in FIG. 1. FIG. 15 is a graph illustrating a relationship of a thickness of a second silicon oxide layer and the diameter of the second through hole. In the following description, for convenience of explanation, the upper side in FIG. 1 is also referred to as an "upper" and the lower side is referred to as a "lower".

The waterproof member 1 illustrated in FIG. 1 includes a laminated body 2 in which four layers are laminated, and through holes 3 and openings 4 formed on the laminated body 2. The through holes 3 are formed with a small diameter (width) enough to prevent passing of water (liquid) and allow passing of gas G. Therefore, for example, if a waterproof member 1 is disposed to cover a cavity shape base, it is possible to allow movement of air (gas) into the base, while preventing the passing of water (liquid) into the base. Hereinafter, such waterproof member 1 will be described in detail.

The laminated body 2 includes an SOI substrate 20 in which a first silicon layer 21 (third layer), a first silicon oxide layer 22 (fourth layer), and a second silicon layer 23 (first layer) are sequentially laminated from a lower side, and a second silicon oxide layer 24 (second layer) disposed on an upper surface (surface of one side of second silicon layer 23) of the SOI substrate 20. As described above, since the laminated body 2 in which the silicon layer and the silicon oxide layer are alternately laminated is used, a configuration of the laminated body 2 is easily implemented. In addition, as also described in a manufacturing method to be described below, since an etching technology is used to form the through holes 3, it is possible to accurately perform etching by using the laminated body 2 in which the silicon layer and the silicon oxide layer having a large etching selection ratio are laminated.

However, a configuration of the laminated body 2 is not limited thereto, and, for example, the second silicon layer 23 may have etching resistance when the first silicon oxide layer 22 is etched, as described in a manufacturing method described below, and, for example, it is possible to use a metal material such as Al, Cu, W, Ti, TiN, and the like. In addition, it is also possible to use the metal material such as Al, Cu, W, Ti, TiN, and the like with respect to the second silicon oxide layer 24.

Among these four layers 21, 22, 23, and 24, the first silicon (Si) layer 21 is a layer for mainly increasing a mechanical strength of the waterproof member 1, and forming a space in a lower side of the second silicon layer 23. In addition, a first silicon oxide ($SiO_2$) layer 22 is a layer for mainly forming a gap between the first silicon layer 21 and the second silicon layer 23. In addition, the second silicon (Si) layer 23 is a layer becoming a base material for forming the second silicon oxide layer 24. In addition, the second silicon oxide ($SiO_2$) layer 24 is a layer for throttling the diameter of the through hole 3 so as to prevent the passing of water, and allow the passing of air.

For example, it is preferable that wastewater treatment on a fluorine compound having a trifluoromethyl group (—CF3) is performed on a surface of the second silicon oxide layer 24. As described above, by performing the wastewater treatment on the surface of the second silicon oxide layer 24, since it is possible to accurately control a contact angle of water on the surface of the second silicon oxide layer 24, it becomes easy to determine the diameter of the through hole 3. When the wastewater treatment is performed by a fluorine compound having a trifluoromethyl group, the contact angle of water on the surface of the second silicon oxide layer 24 is, theoretically, approximately 120°.

In addition, thicknesses of these four layers 21, 22, 23, and 24 are not particularly limited. The thickness of the first silicon layer 21 is preferably approximately equal to or greater than 100 μm and equal to or less than 500 μm, and further preferably approximately equal to or greater than 150 μm and equal to or less than 250 μm. In addition, the thickness of the first silicon oxide layer 22 is preferably approximately equal to or greater than 0.1 μm and equal to or less than 10 μm, and further preferably approximately equal to or greater than 0.1 μm and equal to or less than 0.5 μm. In addition, the thickness of the second silicon layer 23 is preferably approximately equal to or greater than 1.0 μm and equal to or less than 10 μm, and further preferably approximately 1.0 μm. In addition, the thickness of the second silicon oxide layer 24 is preferably approximately equal to or greater than 1.0 μm and equal to or less than 10 μm, and further preferably approximately equal to or greater than 2.0 μm and equal to or less than 5.0 μm. With such a thickness, it is possible to effectively exhibit the described-above effect in the respective layers 21, 22, 23, and 24.

As illustrated in FIG. 2, in a plan view, the laminated body 2 includes a first region S1 in which the through hole 3 is formed positioned at a center portion, and a second region S2 of a frame shape in which the through hole 3 is not formed positioned to surround the first region S1 in an outer edge. As described above, by providing the second region S2 in the outer edge, since it is possible to bond the waterproof member 1 with another member in the second region S2, it is easy to perform attachment to another member. However, the second region S2 may be omitted, and disposition thereof may also be different.

So far, the laminated body 2 is described. Next, the through hole 3 and the opening 4 formed in the laminated body 2 will be described in detail.

A plurality of the through holes 3 are formed by approximately evenly distributing over the entire first region S1 in a plan view. However, the disposition of the through hole 3 is not particularly limited, and may be disposed in a density within the first region S1 (that is, within first region S1, portion having high disposition density and portion having low disposition density of through hole 3 may also exist). In addition, the number of the through holes 3 is not also particularly limited, and may also be one.

The through hole 3 is formed to pass through the second silicon layer 23 and the second silicon oxide layer 24, as illustrated in FIG. 3. In addition, the through hole 3 includes a first through hole 31 that passes through the second silicon layer 23 and a second through hole 32 that passes through the second silicon oxide layer 24.

The first through hole 31 has a circular cross-sectional shape, and a diameter (width) r1 thereof is approximately constant in a depth direction. Therefore, the first through hole 31 is also mentioned to have an approximately cylindrical internal space. However, a shape of the first through hole 31 is not particularly limited, and a cross-sectional shape of the first through hole 31 may be, for example, a square, a triangular, an elliptical, an irregular shape, or the like. In addition, the diameter may be a tapered shape which gradually decreases or gradually increases along the depth direction.

The diameter r1 of the first through hole 31 is not particularly limited. However, the diameter r1 is preferably approximately equal to or greater than 0.5 μm and equal to or less than 20 μm, the diameter r1 is further preferably approximately equal to or greater than 0.8 μm and equal to or less than 1.2 μm, and the diameter r1 is more further preferably approximately 1.0 μm. By setting such a size of the diameter r1, formation of the second through hole 32 becomes easy, as described in a manufacturing method described below.

The second through hole 32 has the circular cross-sectional shape, and the diameter (width) thereof gradually decreases toward an upper side (direction separated from second silicon layer 23). In addition, a gradually decrease rate of the diameter of the second through hole 32 decreases toward the upper side. That is, a slope of an inner periphery surface toward the upper side is great, and an upper end portion thereof is in a state where the inner periphery surface is approximately vertically standing. Therefore, the second through hole 32 includes a diameter gradually decreasing portion 32A of which a diameter gradually decreases toward the upper side and a diameter constant portion 32B of which the diameter is approximately constant toward the upper side connected to an upper side of the diameter gradually decreasing portion 32A. The second through hole 32 is also mentioned to have a funnel shape inner space. According to the configuration, since it is possible to gradually decrease the diameter of the second through hole 32 from a lower side toward the upper side, it is possible to control a diameter (minimum diameter) in an upper surface of the laminated body 2 with high accuracy.

However, a shape of the second through hole 32 is not particularly limited, and a cross-sectional shape of the second through hole 32 may be, for example, a square, a triangular, an elliptical, an irregular shape, or the like. In addition, the diameter constant portion 32B may not be included. In addition, as illustrated in FIG. 4, the gradually decrease rate of the diameter in the diameter gradually decreasing portion 32A may be approximately constant toward the upper side. In addition, as illustrated in FIG. 5, without including the diameter constant portion 32B, furthermore, the diameter gradually decreasing portion 32A may also include a first diameter gradually decreasing portion 32A' in which the gradually decrease rate of the diameter is approximately constant toward the upper side, and a second diameter gradually decreasing portion 32A" in which the gradually decrease rate of the diameter is approximately constant toward the upper side connected to an upper side of the first diameter gradually decreasing portion 32A', and has a gradually decrease rate smaller than that of the first diameter gradually decreasing portion 32A'.

The minimum diameter r2 (that is, diameter of opening on surface side of second silicon oxide layer 24 (upper side of laminated body 2)) of the second through hole 32 is smaller than the diameter r1 of the first through hole 31. Thus, by satisfying relation of r2<r1, it is possible to sufficiently reduce a value of r2, and the through hole 3 which can prevent the passing of water and allow the passing of gas G is obtained. The diameter r2 is not particularly limited. However, for example, it is preferable that the diameter r2 is equal to or greater than 0.1 μm and equal to or less than 10 μm. With this, the through hole 3 can more reliably prevent the passing of water.

In addition, it is preferable that the diameter r2 is small enough to achieve 10 water pressure (that is, passing of water can be prevented even in a state dived 100 m underwater). With this, for example, since waterproof can be exhibited to withstand free diving or the like, the waterproof member 1 having excellent convenience is implemented.

As described above, since a contact angle of water on the surface of the second silicon oxide layer 24 is approximately 120°, it is necessary to set a minimum value of the diameter r2 in approximately equal to or less than 0.144 μm in order to realize the 10 water pressure. When a determination method of the diameter r2 is simply described, as illustrated in FIG. 6, if D=diameter, P=pressure, σ=surface tension, and θ=contact angle, when the surface tension of water (σ=72 dyn/cm: 20° C.), pressure (P=10 atm), and a contact angle (θ=120°) are substituted in a relation in which D=(−4σ cos θ)/P is satisfied, it is possible to obtain D=0.144 μm. As reference, with respect to some of contact angles θ, values of D which can achieve the 10 water pressure are described in table 1 below.

TABLE 1

| θ (°) | D(μm) |
|---|---|
| 100 | 0.05 |
| 110 | 0.099 |
| 120 | 0.144 |
| 130 | 0.185 |
| 140 | 0.221 |
| 150 | 0.249 |
| 160 | 0.271 |
| 170 | 0.284 |
| 180 | 0.288 |

As illustrated in FIG. 1 and FIG. 3, the opening 4 includes first openings 41 formed in the first silicon layer 21 and a second opening 42 formed on the first silicon oxide layer 22. A plurality of the first openings 41 are formed by approximately evenly distributing within the first region S1, and a diameter (width) r3 of each of the first openings 41 is greater than the diameter r1 of the first through holes 31. For example, the first opening 41 may be configured as one opening overlapped over approximately the entirety of the first region S1. However, it is more effective in that it is possible to increase mechanical strength of the first silicon layer 21 by forming the plurality of first openings 41 as the embodiment. Meanwhile, the second opening 42 is configured as one opening overlapped over approximately the entirety of the first region S1, and the first opening 41 and the first through hole 31 communicate with each other through the second opening 42. By such an opening 4, since a gap is formed in a lower side (opposite side to second silicon oxide layer 24) of the first through hole 31, it is possible to precisely manufacture the waterproof member 1, as described in a manufacturing method described below.

So far, a configuration of the waterproof member 1 is described. In the embodiment, the laminated body 2 includes these four layers 21, 22, 23, and 24. However, a configuration of the laminated body 2 may include at least the second silicon layer 23 and the second silicon oxide layer 24. That is, the first silicon layer 21 and the first silicon oxide layer 22 may also be omitted.

Next, a manufacturing method of the waterproof member 1 will be described. As illustrated in FIG. 7, the manufacturing method of the waterproof member 1 includes a preparation process of preparing the SOI substrate 20, a film formation process of forming the second silicon oxide layer 24 on an upper surface of the SOI substrate 20, and a wastewater treatment process of performing the wastewater treatment on the surface of the second silicon oxide layer 24. Hereinafter, the manufacturing method will be described in detail.

Preparation Process

Figure 8:
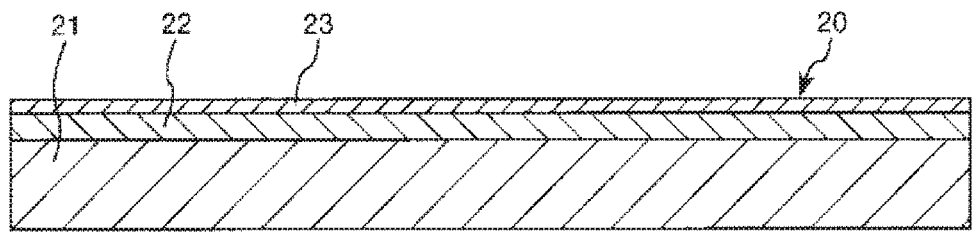
FIG. 8 is a sectional view for explaining the manufacturing method of the waterproof member illustrated in FIG. 1.
Figure 9:
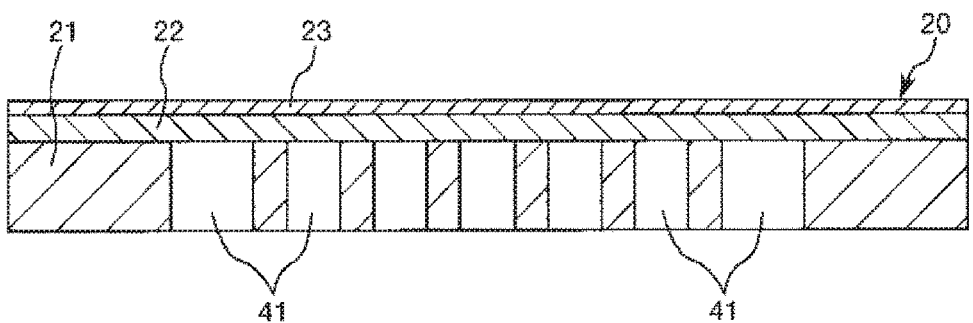
FIG. 9 is a sectional view for explaining the manufacturing method of the waterproof member illustrated in FIG. 1.
Figure 10:
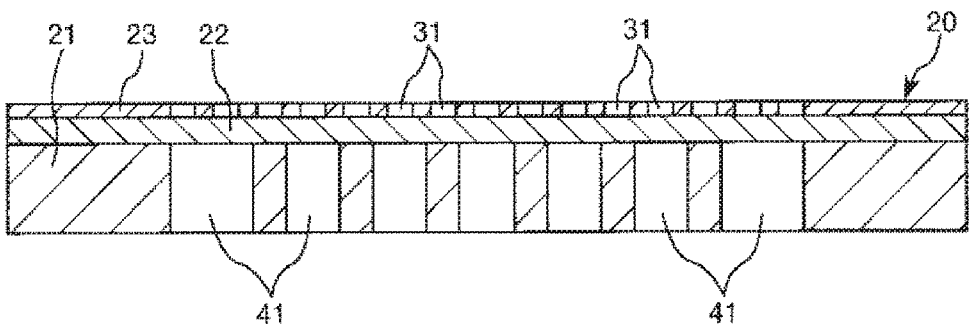
FIG. 10 is a sectional view for explaining the manufacturing method of the waterproof member illustrated in FIG. 1.
Figure 11:
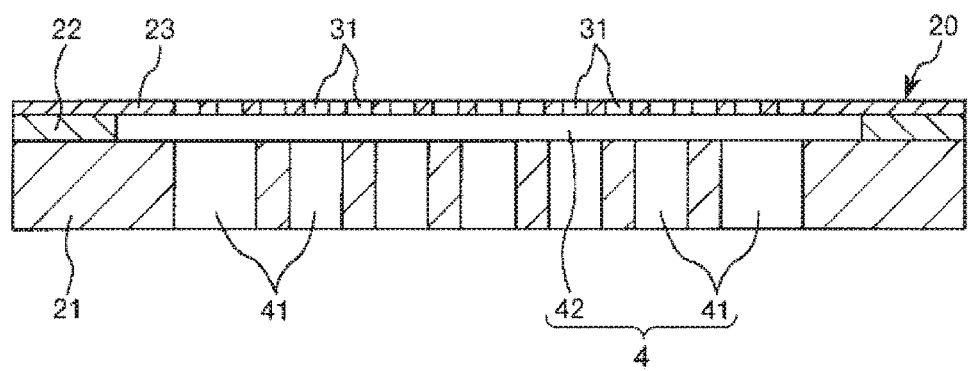
FIG. 11 is a sectional view for explaining the manufacturing method of the waterproof member illustrated in FIG. 1.

First, as illustrated in FIG. 8, the SOI substrate 20 in which the first silicon layer 21, the first silicon oxide layer 22, and the second silicon layer 23 are sequentially laminated from a lower side is prepared. Next, a mask is formed on a lower surface (surface of first silicon layer 21) of the SOI substrate 20, and the first silicon layer 21 is etched through the mask such that the first openings 41 are formed on the first silicon layer 21, as illustrated in FIG. 9. At this time, the first silicon oxide layer 22 functions as a stop layer of the etching. Next, a mask is formed on an upper surface (surface of second silicon layer 23) of the SOI substrate 20, and the second silicon layer 23 is etched through the mask such that the first through holes 31 are formed in the second silicon layer 23, as illustrated in FIG. 10. At this time, the first silicon oxide layer 22 functions as a stop layer of the etching. Next, the first silicon oxide layer 22 is etched through the first openings 41 and the first through holes 31 such that the second opening 42 is formed, as illustrated in FIG. 11. With this, the SOI substrate 20 in which the first openings 41 and the first through holes 31 are formed is obtained. The etching is not particularly limited thereto. However, it is preferable to use, for example, dry etching with respect to the first silicon layer 21 and the second silicon layer 23, and use wet etching with respect to the first silicon oxide layer 22.

Film Formation Process

Figure 12:
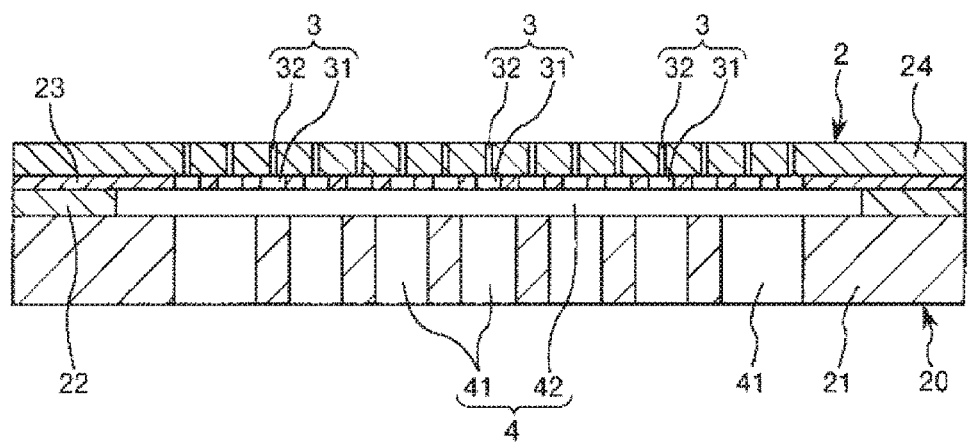
FIG. 12 is a sectional view for explaining the manufacturing method of the waterproof member illustrated in FIG. 1.

Next, by sputtering (vapor phase growth method), a silicon oxide layer is formed on the upper surface of the SOI substrate 20 (surface of second silicon layer 23) such that the second silicon oxide layer 24 in which the second through holes 32 are formed is obtained, as illustrated in FIG. 12. With this, the laminated body 2 in which the through holes 3 and the openings 4 are formed is obtained. In this process, it is preferable to use, for example, silicon (Si) as a target, and use reactive sputtering performed while introducing reactive gas ($O_2$).

Hereinafter, this process will be described in detail. As illustrated in FIG. 13, when the second silicon oxide layer 24 grows, the diameter of the second through hole 32 is abruptly narrowed to block the first through hole 31 at first. However, as illustrated in FIG. 14, the diameter of the second through hole 32 is not almost reduced from a region in which the second silicon oxide layer 24 exceeds a certain thickness, and, after that, the diameter is nearly maintained in a constant state. This is because that a space/gap is formed by the opening 4 on a lower side of the first through hole 31, and $SiO_2$ molecules passed through the second through hole 32 and the first through hole 31 are released to the space/gap such that it is prevented from blocking the second through hole 32. As described above, when the sputtering is performed while a space/gap is formed in a side of the first through hole 31 opposite to a surface on which the second silicon oxide layer 24 is formed, it is possible to easily and more reliably form the second through hole 32 having a sufficiently small diameter.

In the experiment performed by the inventor, the diameter of the second through hole 32 is not changed from the vicinity of a thickness exceeding 3.0 μm, and the diameter thereof is approximately 0.1 μm, when the diameter r1 of the first through hole 31 is 1.0 μm, as also illustrated in a graph of FIG. 15. As described above, according to the formation method of the second through hole 32, it is possible to more reliably manufacture the waterproof member 1 capable of realizing the 10 water pressure. In addition, it is possible to reduce the thickness of the second silicon oxide layer 24, and implement a further thinner waterproof member 1.

Wastewater Treatment Process

Next, the wastewater treatment is performed with a fluorine compound having a trifluoromethyl group ($-CF_3$) on the surface of the second silicon oxide layer 24 such that the waterproof member 1 is obtained.

According to the manufacturing method, it is possible to easily manufacture the waterproof member 1.

Second Embodiment

Next, the pressure sensor according to a second embodiment of the invention will be described.

Figure 16:
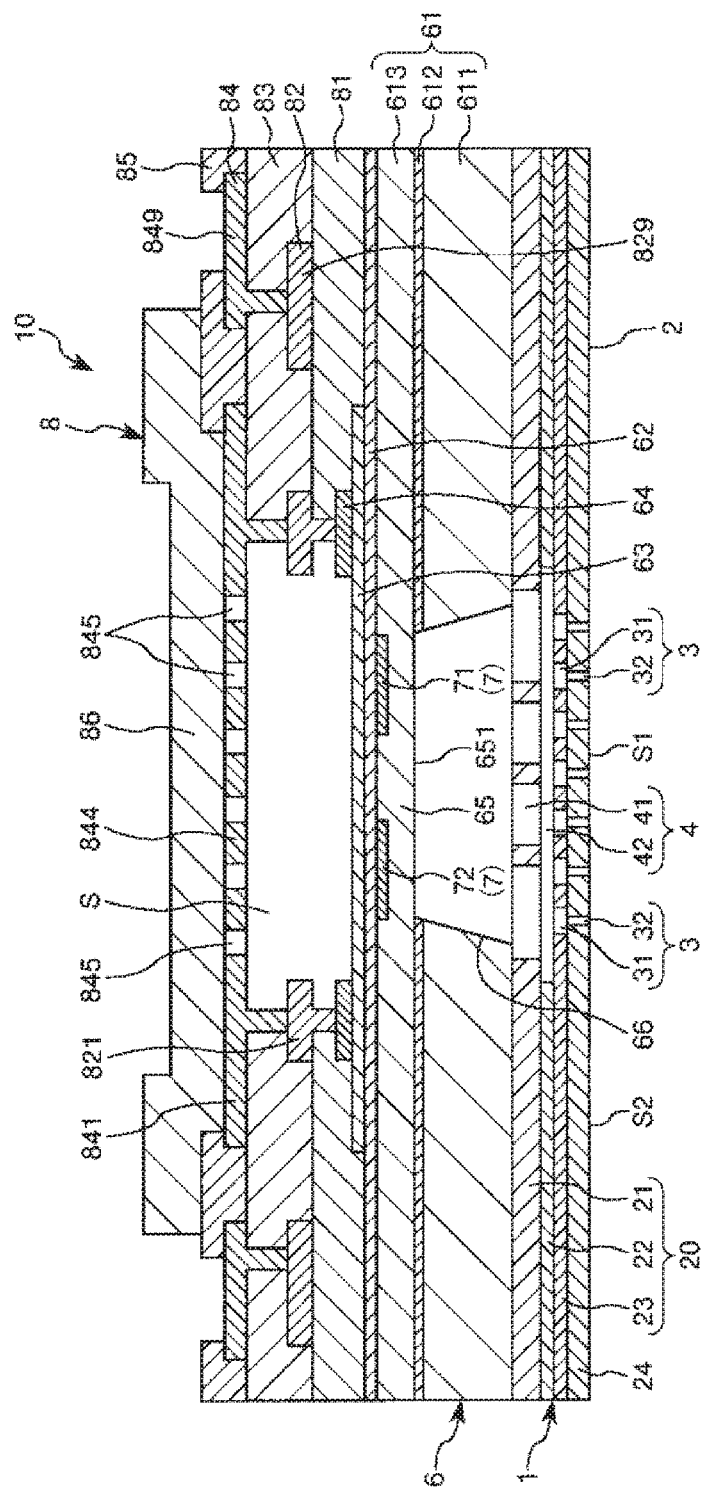
FIG. 16 is a sectional view of a pressure sensor according to a second embodiment of the invention.
Figure 17:
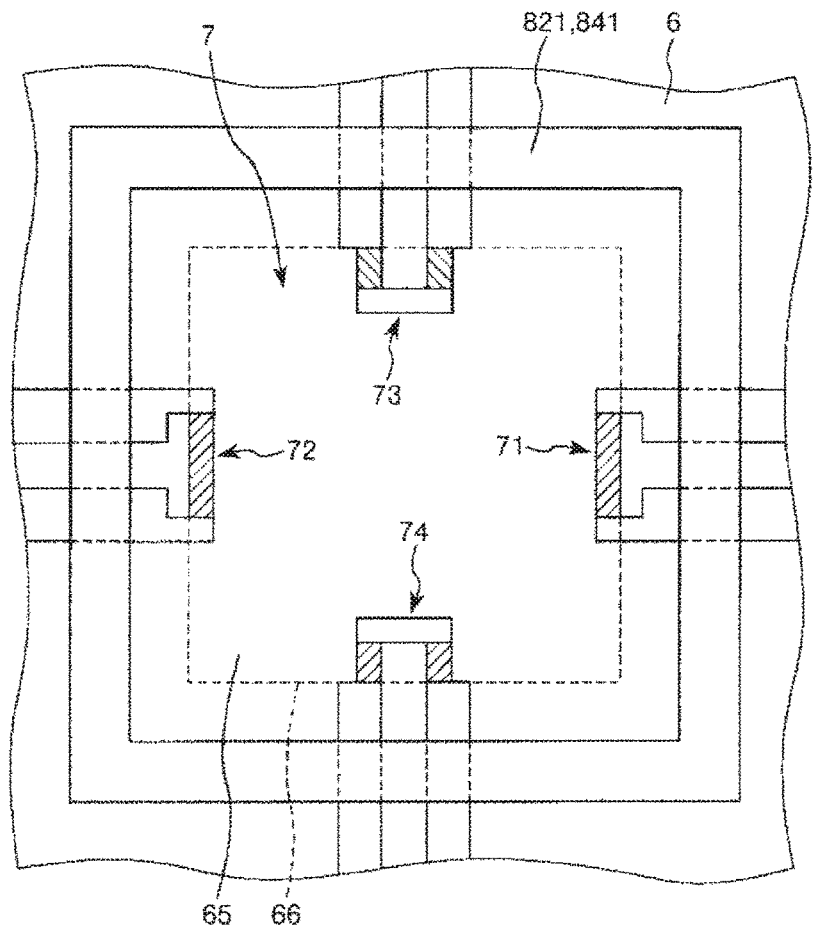
FIG. 17 is a plan view illustrating a sensor unit that is included in the pressure sensor illustrated in FIG. 16.
Figure 18:
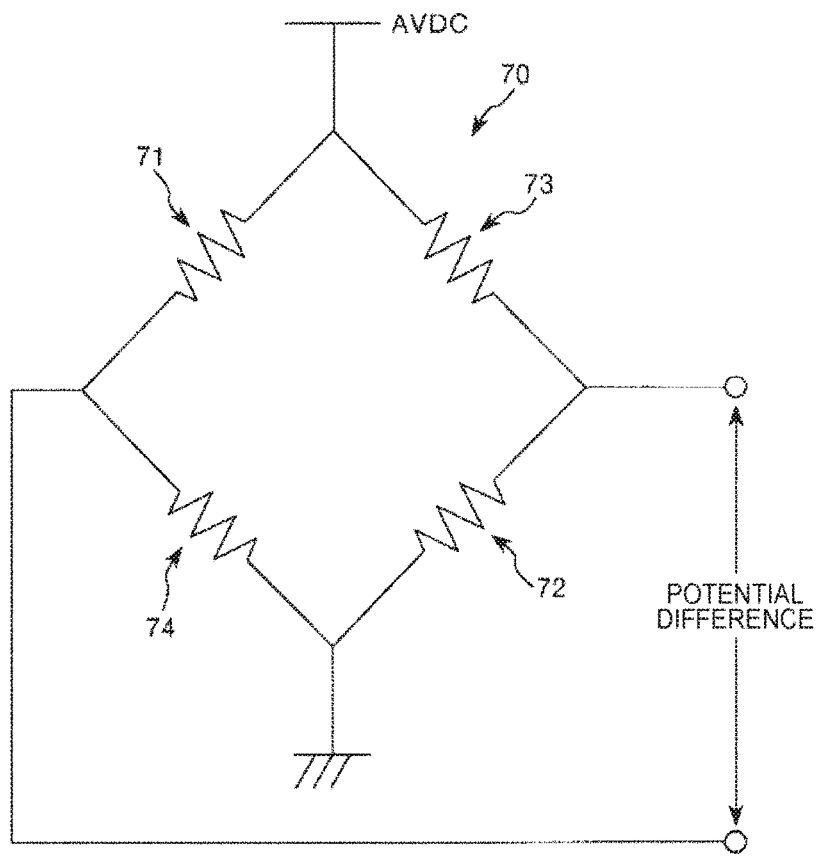
FIG. 18 is a diagram illustrating a bridge circuit including the sensor unit illustrated in FIG. 17.

FIG. 16 is a sectional view of the pressure sensor according to the second embodiment of the invention. FIG. 17 is a plan view illustrating a sensor unit included in the pressure sensor illustrated in FIG. 16. FIG. 18 is a diagram illustrating a bridge circuit including the sensor unit illustrated in FIG. 17. Hereinafter, for convenience of explanation, the upper side in FIG. 16 is also referred to as an "upper" and the lower side is referred to as a "lower".

A pressure sensor 10 includes a substrate 6, a sensor unit 7 provided on the substrate 6, a surrounding structure 8 disposed on an upper surface of the substrate 6, a hollow portion S partitioned by the substrate 6 and the surrounding structure 8, and the waterproof member 1 provided on a lower surface of the substrate 6, illustrated in FIG. 16. Hereinafter, each part thereof will be sequentially described.

Substrate

As illustrated in FIG. 16, the substrate 6 is configured by sequentially laminating a first insulating film 62 configured by a silicon oxide film ($SiO_2$ film), a second insulating film 63 configured by a silicon nitride film (SiN film), and a polysilicon film 64 on a semiconductor substrate 61 that is an SOI substrate (laminated substrate of silicon layer 611, silicon oxide layer 612, and silicon layer 613). However, the semiconductor substrate 61 is not limited to the SOI substrate, and can also use, for example, a silicon substrate. In addition, if it is also possible to exhibit etching resistance and insulation properties with respect to the first insulating film 62 and the second insulating film 63, material is not particularly limited thereto. In addition, the first insulating film 62, the second insulating film 63, and the polysilicon film 64 may be provided, or omitted according to necessity.

In addition, a diaphragm 65 thinner than a periphery portion and to be deformed by receiving the pressure is provided on the semiconductor substrate 61. The diaphragm 65 is formed in a bottom portion of a concave portion 66 by providing the concave portion 66 with a bottom which is opened on a lower surface of the semiconductor substrate 61, and a lower surface (bottom surface of concave portion 66) of the diaphragm 65 becomes a pressure receiving surface 651.

In addition, a semiconductor circuit (circuit) (not illustrated) electrically connected to the sensor unit 7 is built on the semiconductor substrate 61 and in upward of the semiconductor substrate 61. A circuit element such as an active element such as a MOS transistor and the like, a capacitor, an inductor, a resistor, a diode, a wire, and the like, formed according to necessity is included in the semiconductor circuit. However, the semiconductor circuit may also be omitted.

Sensor Unit

As illustrated in FIG. 17, the sensor unit 7 includes four piezoresistive elements 71, 72, 73, and 74 provided in the diaphragm 65. In addition, the piezoresistive elements 71, 72, 73, and 74 are electrically connected to each other through wires or the like, configure a bridge circuit 70 (wheatstone bridge circuit) illustrated in FIG. 18, and are connected to the semiconductor circuit.

A drive circuit (not illustrated) for supplying a drive voltage AVDC is connected to the bridge circuit 70. Accordingly, the bridge circuit 70 outputs a signal (voltage) in accordance with a resistance value change of the piezoresistive elements 71, 72, 73, and 74 based on deflection of the diaphragm 65. Therefore, it is possible to detect the pressure received by the diaphragm 65 based on the output signal.

For example, each of the piezoresistive elements 71, 72, 73, and 74 is configured by doping (diffusion and injection) an impurity such as phosphorus, boron, and the like into the semiconductor substrate 61 (silicon layer 613). In addition, for example, the wiring for connecting these piezoresistive elements 71 to 74 is configured by doping (diffusion and injection) the impurity such as phosphorus, boron, and the like at a concentration higher than that of the piezoresistive elements 71 to 74 into the semiconductor substrate 61 (silicon layer 613).

Hollow Portion

As illustrated in FIG. 16, the hollow portion S is partitioned to surround the substrate 6 and the surrounding structure 8. The hollow portion S is a sealed space, and functions as a pressure reference chamber that becomes a reference value detected by the pressure sensor 10. In addition, the hollow portion S is disposed at an opposite side to the pressure receiving surface 651 of the diaphragm 65, and disposed by overlapping with the diaphragm 65. It is preferable that the hollow portion S is in a vacuum state (for example, approximately equal to or less than 10 Pa). With this, it is possible to use the pressure sensor 10 as a so-called "absolute pressure sensor" for detecting the pressure on the basis of the vacuum, and a highly convenient pressure sensor 10 is implemented. However, the hollow portion S may also not be vacuum state if a constant pressure is maintained.

Surrounding Structure

As illustrated in FIG. 16, the surrounding structure 8 partitioning the hollow portion S together with the substrate 6 includes an interlayer insulation film 81, a wiring layer 82 disposed on the interlayer insulation film 81, an interlayer insulation film 83 disposed on the wiring layer 82 and the interlayer insulation film 81, a wiring layer 84 disposed on the interlayer insulation film 83, a surface protection film 85 disposed on the wiring layer 84 and the interlayer insulation film 83, and a sealing layer 86 disposed on the wiring layer 84 and the surface protection film 85.

The wiring layer 82 includes a frame shape wiring portion 821 disposed to surround the hollow portion S and a circuit wiring portion 829 for configuring the wiring of the semiconductor circuit. Similarly, the wiring layer 84 includes a frame shape wiring portion 841 disposed to surround the hollow portion S and a circuit wiring portion 849 for configuring the wiring of the semiconductor circuit. Accordingly, the semiconductor circuit is presented on an upper surface of the surrounding structure 8 by the circuit wiring portions 829 and 849.

In addition, the wiring layer 84 includes a coating layer 844 positioned at upward (ceiling side) of the hollow portion S. Accordingly, a plurality of through holes (pore) 845 for communicating an inside and an outside of the hollow portion S are provided on the coating layer 844. In addition, the sealing layer 86 is disposed on the coating layer 844, and the through holes 845 are sealed by the sealing layer 86.

The surface protection film 85 has a function for protecting the surrounding structure 8 from moisture, dirt, and scratches. The surface protection film is disposed on the interlayer insulation film 83 and the wiring layer 84 so as not to block the through holes 845 of the coating layer 844.

For example, it is possible to use the insulating film such as the silicon oxide film (SiO$_2$ film) and the like as the interlayer insulation films 81 and 83 among the surrounding structure 8. In addition, for example, it is possible to use a metal film such as an aluminum film as the wiring layers 82 and 84. In addition, for example, it is possible to use a metal film such as Al, Cu, W, Ti, TiN, and the like, the silicon oxide film, or the like as the sealing layer 86. In addition, for example, it is possible to use the silicon oxide film, the silicon nitride film, a polyimide film, an epoxy resin film, or the like as the surface protection film 85.

Waterproof Member

As illustrated in FIG. 16, the waterproof member 1 is bonded to a lower surface of the substrate 6 in the second region S2 when the second silicon oxide layer 24 is set as a lower side (outside). In addition, the first region S1 is disposed to overlap with the concave portion 66, and an inside and an outside of the concave portion 66 communicate with each other through the through holes 3 and the openings 4. Therefore, without inhibiting reception pressure on the pressure receiving surface 651, it is possible to reduce attachment of water on the pressure receiving surface 651 such that the pressure sensor 10 with a high pressure sensing accuracy is implemented.

Third Embodiment

Next, the electronic module according to the third embodiment of the invention will be described.

Figure 19:
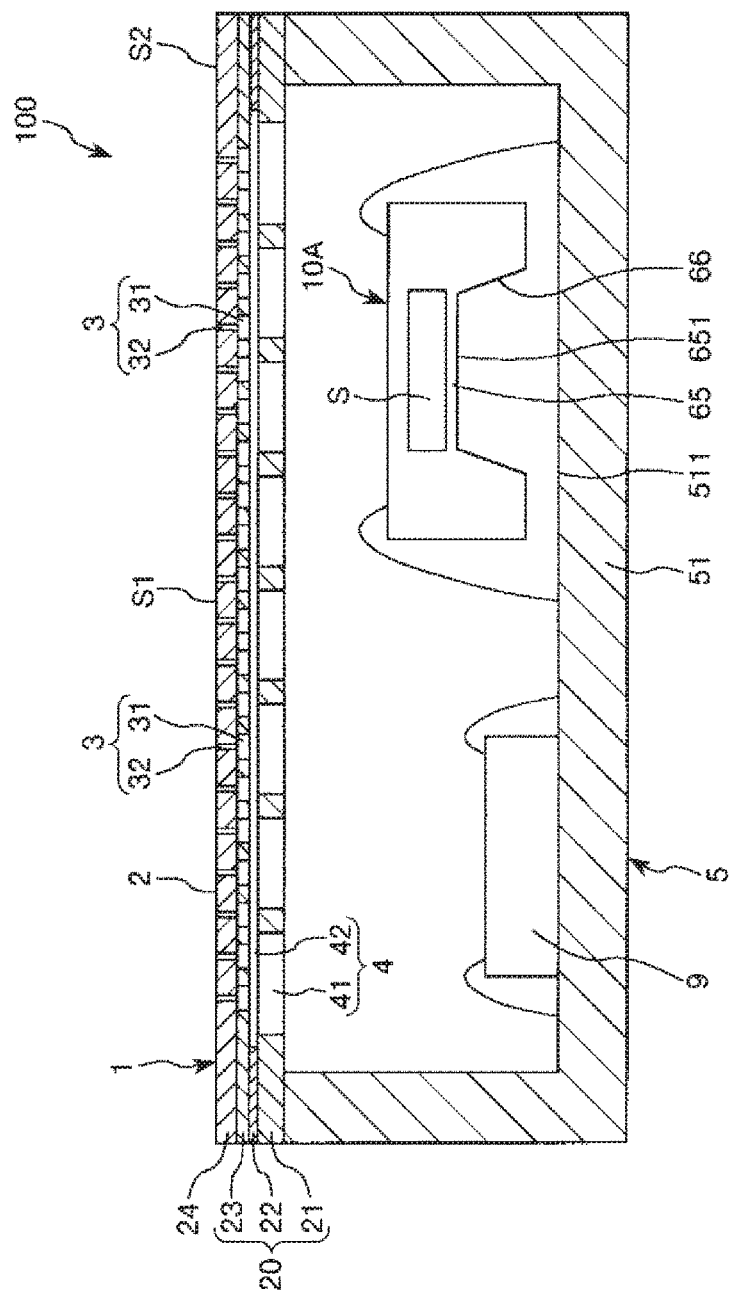
FIG. 19 is a sectional view of an electronic module according to a third embodiment of the invention.

FIG. 19 is a sectional view of an electronic module according to a third embodiment of the invention. Hereinafter, for convenience of explanation, the upper side in FIG. 19 is referred to as an "upper" and the lower side is referred to as a "lower".

An electronic module 100 illustrated in FIG. 19 includes a package 5, and a pressure sensor (electronic component) 10A and an IC (electronic component) 9 accommodated within the package 5.

Package

The package 5 includes a box shape base 51 including a concave portion 511 of which an upper surface is opened, and the waterproof member 1 as a cover body bonded to an upper surface of the base 51 so as to block an opening of the concave portion 511. In addition, the waterproof member 1 is bonded to an upper surface of the base 51 in the second region S2, when the second silicon oxide layer 24 is set as an upper side (outside). In addition, the first region S1 is disposed to overlap with the concave portion 511, and an inside and an outside of the concave portion 511 communicate with each other through the through holes 3 and the openings 4.

Constituent material of the base 51 is not particularly limited. However, for example, insulating materials of various types of ceramics such as oxide ceramics such as alumina, silica, titania, zirconia, and the like, and nitride ceramics such as silicon nitride, aluminum nitride, titanium nitride, and the like, and various resin materials such as polyethylene, polyamide, polyimide, polycarbonate, acrylic resin, ABS resin, epoxy resin, and the like are mentioned, and it is possible to use a combined material by combining one or a combination of two or more among these materials.

Pressure Sensor

The pressure sensor 10A is implemented by a configuration in which the waterproof member 1 is omitted from the configuration of the above-described second embodiment. Accordingly, the pressure sensor 10A is supported to be floated from a bottom of the concave portion 511 by a bonding wire. As described above, by floating the pressure sensor 10A, it is unlikely to transmit stress from outside to the pressure sensor 10A, and it is possible to reduce reduction of pressure sensing accuracy. In addition, the pressure sensor 10A is electrically connected to a wire (not illustrated) provided in the base 51 by the bonding wire.

IC

The IC 9 is fixed on a bottom of the concave portion 511, and disposed in parallel with the pressure sensor 10A. In addition, the IC 9 is electrically connected to the wire (not illustrated) provided in the base 51 by the bonding wire, and electrically connected to the pressure sensor 10A and an external connection terminal (not illustrated) provided on a bottom of the base 51 through the wire.

In such an IC 9, for example, the drive circuit for supplying a voltage to the bridge circuit 70, a temperature compensation circuit for performing temperature compensation on the output from the bridge circuit 70, a pressure detection circuit for obtaining pressure applied from the output from the temperature compensation circuit, an output circuit for converting the output from the pressure detection circuit into a predetermined output format (CMOS, LV-PECL, LVDS, and the like) and outputting the converted result, and the like are included. Some of the drive circuit, the temperature compensation circuit, the pressure detection circuit, the output circuit, and the like (for example, drive circuit) may be formed in the semiconductor circuit within the pressure sensor 10A.

According to the electronic module 100 of such a configuration, since the opening of the concave portion 511 is blocked by the waterproof member 1, without inhibiting pressure detection (reception pressure on pressure receiving surface 651) in the pressure sensor 10A, it is possible to reduce entrance of water into the concave portion 511. Therefore, the electronic module 100 having a waterproof function is implemented. Particularly, as in the related art, since it is not necessary to fill the concave portion 511 with the gel or the like so as to grant the waterproofness, the electronic module 100 of which a configuration is easy and manufacturing is also easy is implemented.

If it is possible to detect the pressure, a configuration of the pressure sensor 10A is not particularly limited thereto. In addition, for example, the IC 9 may also be omitted. In addition, in the embodiment, a configuration in which the pressure sensor 10A and the IC 9 are used as the electronic component accommodated in the package 5 is described. However, the electronic component is not particularly limited thereto. For example, the electronic component may also be a physical quantity sensor such as an accelerometer, an angular velocity sensor, and the like, and a vibrator used in an oscillator or the like.

Fourth Embodiment

Next, an altimeter according to a fourth embodiment of the invention will be described.

Figure 20:
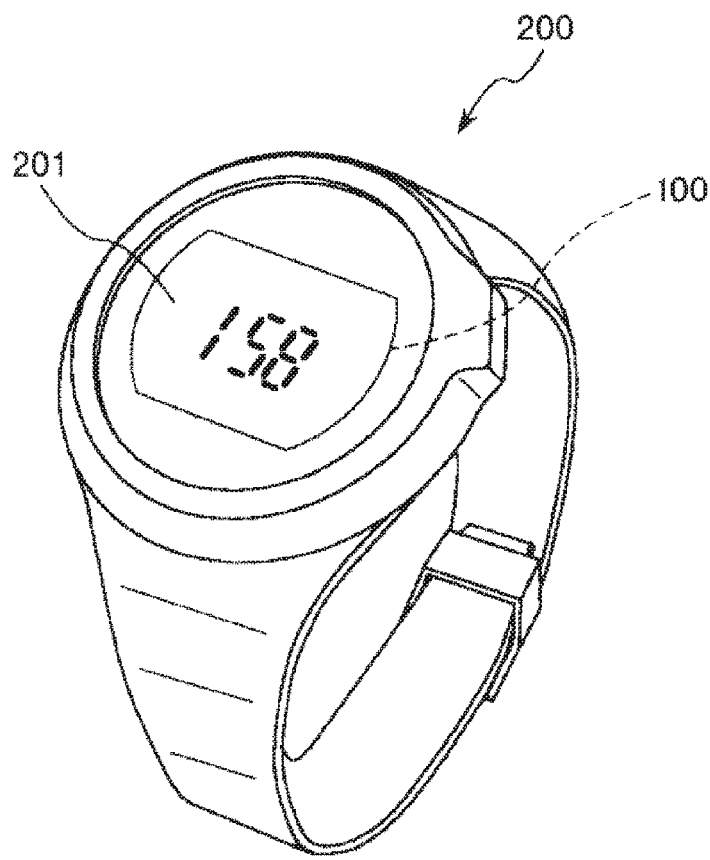
FIG. 20 is a perspective view illustrating an example of an altimeter.

FIG. 20 is a perspective view illustrating an example of an altimeter.

As illustrated in FIG. 20, an altimeter 200 can be worn on the wrist like a wristwatch. In addition, the electronic module 100 is accommodated inside the altimeter 200, and can display an altitude from a current position of the sea level or atmospheric pressure at the current position on a display unit 201. It is possible to display various items of information such as a current time, a heart rate of the user, the weather, and the like on the display unit 201. Since the altimeter 200 includes the electronic module 100, and has the waterproofness, it is possible to exhibit high reliability.

In addition to the altimeter 200, for example, an electronic module 100 may be mounted in a wristwatch type depth meter used in free diving or the like. In this case, since it is possible to maintain the waterproofness up to the 10 water pressure, that is, a depth of 100 m, it is possible to exhibit excellent convenience and reliability.

Fifth Embodiment

Next, an electronic apparatus according to a fifth embodiment of the invention will be described.

Figure 21:
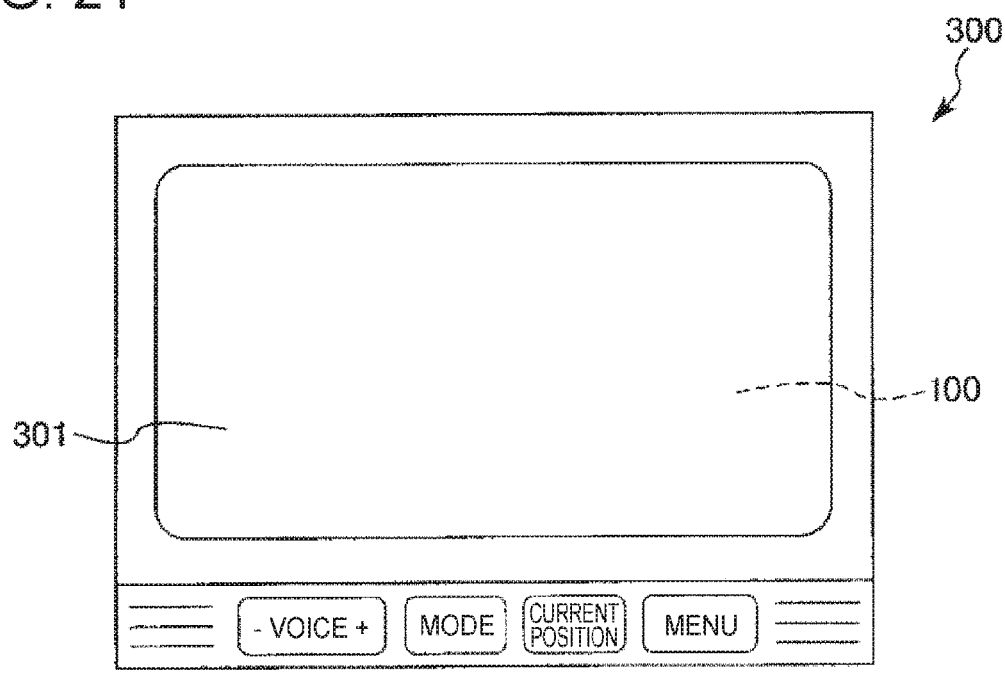
FIG. 21 is a front view illustrating an example of an electronic apparatus.

FIG. 21 is a front view illustrating an example of an electronic apparatus.

The electronic apparatus of the embodiment is a navigation system 300 including the electronic module 100. As illustrated in FIG. 21, the navigation system 300 includes a position information obtaining unit for obtaining position information from map information and a global positioning system (GPS), an autonomous navigation unit by a gyro sensor and an acceleration sensor and vehicle speed data, which are not illustrated, the electronic module 100, and a display unit 301 for displaying predetermined position information or course information.

According to the navigation system 300, it is possible to obtain altitude information by the electronic module 100 in addition to the obtained position information. Therefore, by detecting change of altitude according to entering from a general road to an elevated road (or vice versa), it is possible to determine whether traveling on the general road or the elevated road, and it is possible to provide navigation information to users in an actual traveling state. Since the navigation system 300 includes the electronic module 100, it is possible to exhibit high reliability.

The electronic apparatus including the electronic module according to the invention is not limited to the navigation system. For example, the electronic apparatus can be applied to personal computers, mobile phones, smart phones, tablet computers, watches (including smart watch), medical equipment (for example, electronic thermometers, blood pressure monitors, blood glucose meter, electrocardiogram measuring device, ultrasound diagnostic device, and electronic endoscope), various measuring instruments, gauges (for example, gauges of vehicle, aircraft, and ship), flight simulators, or the like.

Sixth Embodiment

Next, a moving object according to a sixth embodiment of the invention will be described.

Figure 22:
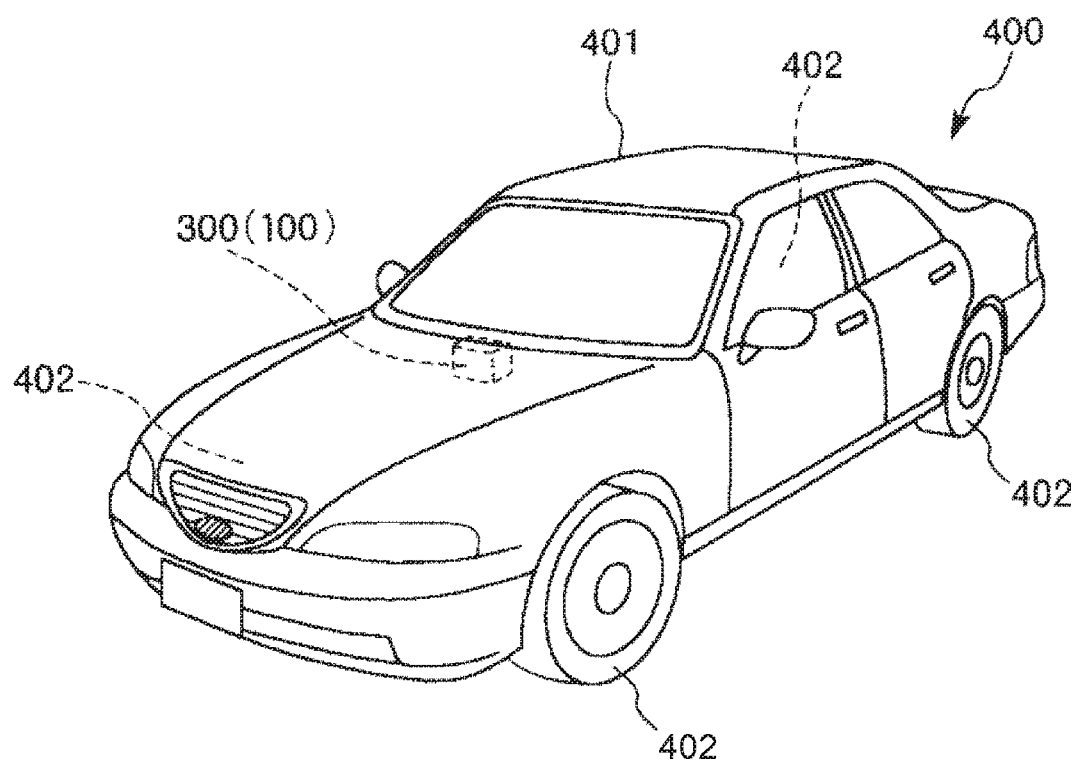
FIG. 22 is a perspective view illustrating an example of a moving object.

FIG. 22 is a perspective view illustrating an example of the moving object.

The moving object of the embodiment is an automobile 400 including the electronic module 100. As illustrated in FIG. 22, the automobile 400 includes a vehicle body 401 and four wheels 402, and is configured to rotate the wheels 402 by power source (engine) (not illustrated) provided in the vehicle body 401. The navigation system 300 (electronic module 100) is built in the automobile 400. Since the automobile 400 includes the electronic module 100, it is possible to exhibit high reliability.

So far, the waterproof member, the manufacturing method of the waterproof member, the pressure sensor, and the electronic module according to the invention are described based on embodiments illustrated. However, the invention is not limited thereto, and a configuration of each part can be replaced with any configuration having a similar function. In addition, any other constituents and processes may be added. In addition, embodiments can also be appropriately combined with each other.

The entire disclosure of Japanese Patent Application No. 2016-025612, filed Feb. 15, 2016 is expressly incorporated by reference herein.

What is claimed is:

1. A waterproof member comprising:
a laminated body that includes a first layer and a second layer provided in one side of the first layer; and
a through hole that is provided in the laminated body, prevents passing of liquid, and allows passing of gas,
wherein the through hole includes
a first through hole that passes through the first layer, and
a second through hole that passes through the second layer, and communicates with the first through hole, and
wherein a width of the second through hole is smaller than a width of the first through hole.

2. The waterproof member according to claim 1,
wherein the width of the second through hole gradually decreases toward a direction which is separated from the first layer.

3. The waterproof member according to claim 2,
wherein a gradually decrease rate of the width of the second through hole gradually decreases toward the direction which is separated from the first layer.

4. The waterproof member according to claim 1,
wherein the width of the second through hole on a surface of the second layer opposite to the first layer is equal to or greater than 0.1 μm, and equal to or less than 10 μm.

5. The waterproof member according to claim 4,
wherein the laminated body includes a third layer provided on the first layer opposite to the second layer, and
wherein the third layer includes a first opening having a width greater than that of the through hole.

6. The waterproof member according to claim 5,
wherein the laminated body includes a fourth layer that is provided between the first layer and the third layer, and forms a gap between the first through hole and the first opening,
wherein the fourth layer includes a second opening having a width greater than that of the through hole, and
wherein the through hole and the first opening communicate with each other through the second opening.

7. A manufacturing method of a waterproof member comprising:
preparing a first layer in which a first through hole is provided; and
film-forming a second layer having a second through hole communicating with the first through hole on one surface of the first layer, by a vapor phase growth method,
wherein a width of the second through hole is smaller than that of the first through hole.

8. The manufacturing method of a waterproof member according to claim 7, wherein the vapor phase growth method is performed in a state where a gap is formed in a side of the first through hole opposite to a side on which the second layer is formed.

9. A pressure sensor comprising:
a substrate that includes a diaphragm;
a pressure reference chamber that is positioned at one side of the diaphragm; and
the waterproof member according to claim 1 provided in the other side of the diaphragm,
wherein the diaphragm and the waterproof member are sealed in a liquid tight manner.

10. A pressure sensor comprising:
a substrate that includes a diaphragm;
a pressure reference chamber that is positioned at one side of the diaphragm; and
the waterproof member according to claim 2 provided in the other side of the diaphragm,
wherein the diaphragm and the waterproof member are sealed in a liquid tight manner.

11. A pressure sensor comprising:
a substrate that includes a diaphragm;
a pressure reference chamber that is positioned at one side of the diaphragm; and
the waterproof member according to claim 3 provided in the other side of the diaphragm,
wherein the diaphragm and the waterproof member are sealed in a liquid tight manner.

12. A pressure sensor comprising:
a substrate that includes a diaphragm;
a pressure reference chamber that is positioned at one side of the diaphragm; and
the waterproof member according to claim 4 provided in the other side of the diaphragm,
wherein the diaphragm and the waterproof member are sealed in a liquid tight manner.

13. A pressure sensor comprising:
a substrate that includes a diaphragm;
a pressure reference chamber that is positioned at one side of the diaphragm; and
the waterproof member according to claim 5 provided in the other side of the diaphragm,
wherein the diaphragm and the waterproof member are sealed in a liquid tight manner.

14. A pressure sensor comprising:
a substrate that includes a diaphragm;
a pressure reference chamber that is positioned at one side of the diaphragm; and
the waterproof member according to claim 6 provided in the other side of the diaphragm,
wherein the diaphragm and the waterproof member are sealed in a liquid tight manner.

15. An electronic module comprising:
a package that includes
a base including a concave portion, and
the waterproof member according to claim 1 bonded to the base so as to block an opening of the concave portion; and
an electronic component that is accommodated within the concave portion of the package.

16. An electronic module comprising:
a package that includes
a base including a concave portion, and
the waterproof member according to claim 2 bonded to the base so as to block an opening of the concave portion; and
an electronic component that is accommodated within the concave portion of the package.

17. An electronic module comprising:
a package that includes
a base including a concave portion, and
the waterproof member according to claim 3 bonded to the base so as to block an opening of the concave portion; and
an electronic component that is accommodated within the concave portion of the package.

18. An electronic module comprising:
a package that includes
a base including a concave portion, and
the waterproof member according to claim 4 bonded to the base so as to block an opening of the concave portion; and
an electronic component that is accommodated within the concave portion of the package.

19. An electronic module comprising:
a package that includes
a base including a concave portion, and
the waterproof member according to claim 5 bonded to the base so as to block an opening of the concave portion; and
an electronic component that is accommodated within the concave portion of the package.

20. An electronic module comprising:
a package that includes
a base including a concave portion, and
the waterproof member according to claim 6 bonded to the base so as to block an opening of the concave portion; and
an electronic component that is accommodated within the concave portion of the package.

* * * * *